US006816411B2

(12) United States Patent
Arai et al.

(10) Patent No.: US 6,816,411 B2
(45) Date of Patent: Nov. 9, 2004

(54) NON-VOLATILE SEMICONDUCTOR STORAGE DEVICE COMPOSED OF NAND TYPE EEPROM AND DELETION VERIFICATION METHOD IN NON-VOLATILE SEMICONDUCTOR STORAGE DEVICE (75) Inventors: Fumitaka Arai, Yokohama (JP); Toshitake Yaegashi, Yokohama (JP); Yasuhiko Matsunaga, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/609,440

(22) Filed: Jul. 1, 2003

(65) Prior Publication Data
US 2004/0105310 A1 Jun. 3, 2004

(30) Foreign Application Priority Data
Nov. 29, 2002 (JP) ........................................ 2002-348932

(51) Int. Cl.[7] .............................................. G11C 16/04
(52) U.S. Cl. ............................... 365/185.17; 365/185.22
(58) Field of Search ....................... 365/185.17, 185.22, 365/230.06, 185.01, 189.04

(56) References Cited

U.S. PATENT DOCUMENTS

| 5,872,734 | A | * | 2/1999 | Tanaka et al. | ......... | 365/185.24 |
|---|---|---|---|---|---|---|
| 6,134,140 | A | | 10/2000 | Tanaka et al. | | |
| 6,137,720 | A | * | 10/2000 | Lancaster | .............. | 365/185.11 |
| 6,208,560 | B1 | | 3/2001 | Tanaka et al. | | |
| 6,314,026 | B1 | | 11/2001 | Satoh et al. | | |
| 6,434,055 | B2 | | 8/2002 | Tanaka et al. | | |
| 6,459,612 | B2 | | 10/2002 | Satoh et al. | | |
| 6,493,265 | B2 | | 12/2002 | Satoh et al. | | |
| 6,549,464 | B2 | | 4/2003 | Tanaka et al. | | |

FOREIGN PATENT DOCUMENTS

| JP | 7-161852 | 6/1995 |
|---|---|---|
| JP | 11-250676 | 9/1999 |

* cited by examiner

*Primary Examiner*—Thong Q. Le
(74) *Attorney, Agent, or Firm*—Oblon, Spivak, McClelland, Maier & Neustadt, P.C.

(57) ABSTRACT

A NAND column has memory cell transistors connected in series by a current passage. Word line drive circuits supply a low voltage to a word lines. A potential supply circuit supplies a high potential higher than the low potential, to a semiconductor region in which the memory cell transistors are formed, to delete contents stored in the memory cell transistors. In deletion verification which verifies that the contents stored in the memory cell transistors have been deleted, a read is executed on each of the word lines. In the read, the word line drive circuit provides the selected one of the word lines with a determination potential used to determine whether or not the contents have been deleted, while providing the other non-selected word lines with a read potential higher than the determination potential.

28 Claims, 7 Drawing Sheets

NON-VOLATILE SEMICONDUCTOR STORAGE DEVICE COMPOSED OF NAND TYPE EEPROM AND DELETION VERIFICATION METHOD IN NON-VOLATILE SEMICONDUCTOR STORAGE DEVICE

CROSS-REFERENCE TO RELATED APPLICATIONS

This application is based upon and claims the benefit of priority from the prior Japanese Patent Application No. 2002-348932, filed Nov. 29, 2002, the entire contents of which are incorporated herein by reference.

BACKGROUND OF THE INVENTION

1. Field of the Invention

The present invention relates to a non-volatile semiconductor storage device, and in particular, to a NAND type EEPROM and its deletion verification method.

2. Description of the Related Art

Figure 1:
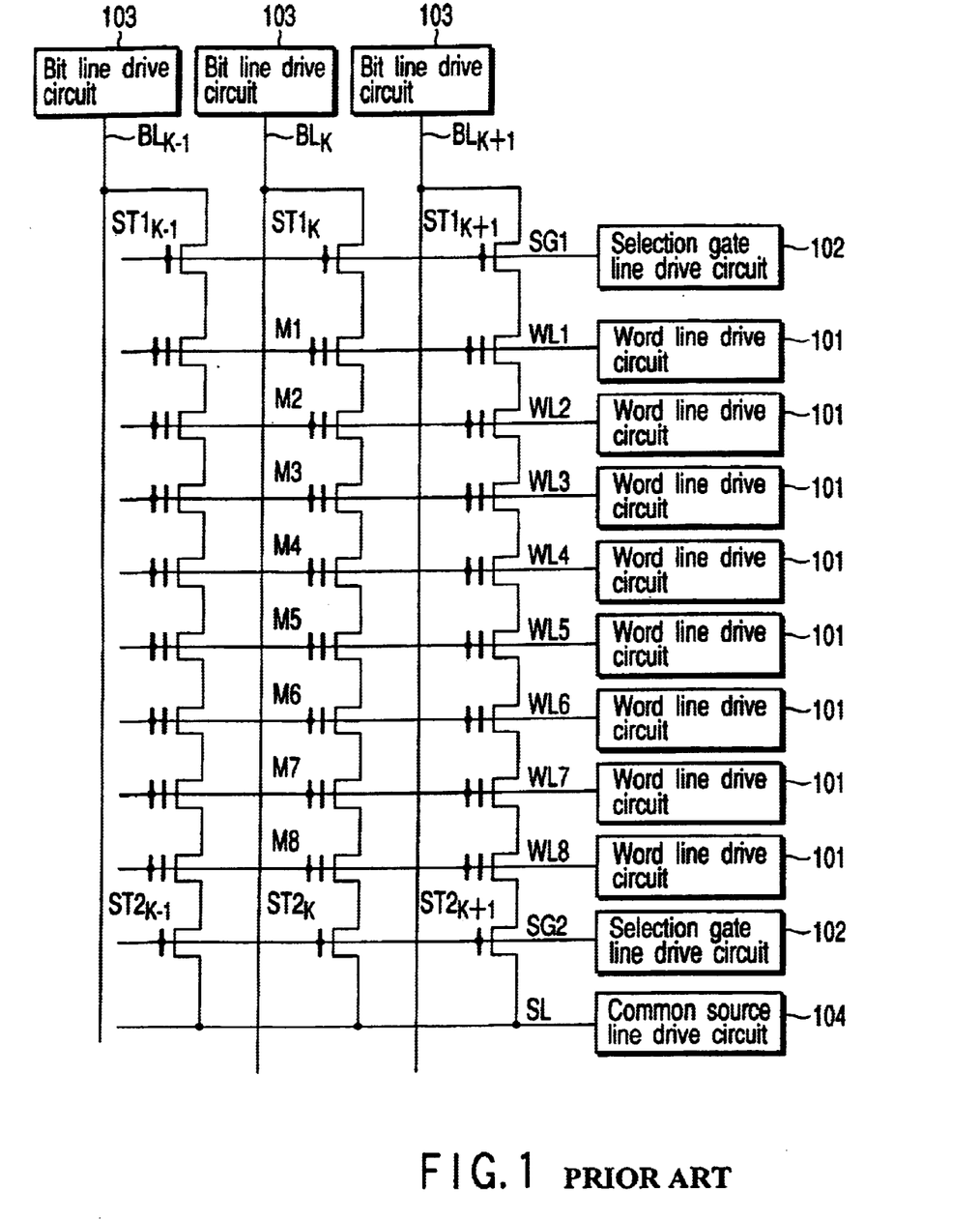
FIG. 1 is a circuit diagram of a NAND type EEPROM as an example of a conventional non-volatile semiconductor storage device.

FIG. 1 is a circuit diagram showing a NAND type EEPROM (Electrically Erasable and Programmable Read Only Memory) as an example of a conventional non-volatile semiconductor storage device.

In the NAND type EEPROM, a NAND column is composed of memory cell transistors M1, M2, . . . , M8 connected in series by connecting their sources and drains together. Word lines WL1, WL2, . . . , WL8 are connected to gates of the memory cell transistors M1 to M8, respectively.

Selection gate transistors $ST1_k$ and $ST2_k$ are connected to the opposite ends, respectively, of the NAND column. Selection gate lines SG1 and SG2 are connected to gates of the section gate transistors $ST1_k$ and $ST2_k$, respectively. A bit line $BL_k$ is connected to the selection gate transistor $ST1_k$. A common source line SL is connected to the selection gate transistor $ST2_k$.

Further, a plurality of other NAND columns are arranged adjacent to the above NAND column. A selection gate transistor $ST1_{k-1}$ or $ST1_{k+1}$ is connected to one end of each of the plurality of NAND columns. Bit lines $BL_{k-1}$ and $BL_{k+1}$ are connected to the selection gate transistors $ST1_{k-1}$ and $ST1_{k+1}$, respectively. Furthermore, a selection gate transistor $ST2_{k-1}$ or $ST2_{k+1}$ is connected to the other end of each of the plurality of NAND columns. A common source line S1 is connected to the selection gate transistors $ST2_{k-1}$ and $ST2_{k+1}$.

Furthermore, work lines WL1 to WL8, the selection gate lines SG1 and SG2, bit lines $BL_{k-1}$, $BL_k$, and $BL_{k+1}$, and the common source line SL are provided with drive circuits 101, 102, 103, and 104, respectively.

With this configuration, adjacent cell transistors can share their sources and drains. This reduces the area of the transistors required for wiring. Thus, the NAND type EEPROM is characterized by its structure suitable for increased density. Further, the gate potentials of a large number of cell transistors can be simultaneously driven via the word lines WL1, WL2, . . . , WL8. Accordingly, data can be written to a large number of cell transistors at high speed or can be deleted or read from them at high speed.

Figure 2:
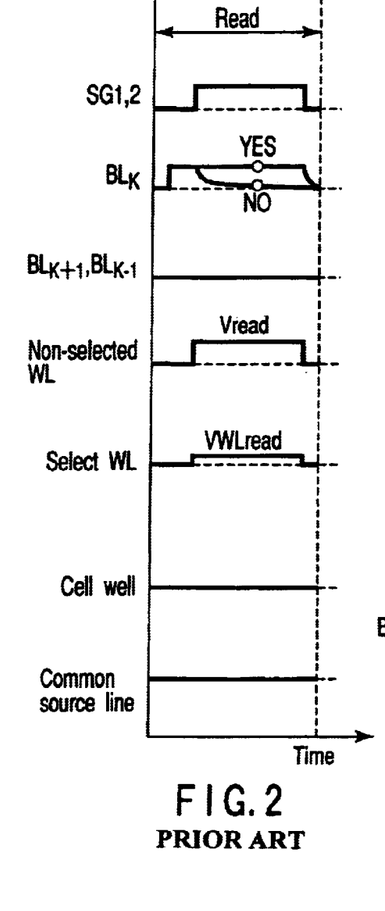
FIG. 2 is a time chart showing a read operation in the conventional NAND type EEPROM.

FIG. 2 is a time chart showing the case in which a read operation is performed in the NAND type EEPROM.

A NAND type EEPROM composed of the series-connected cell transistors M1, M2, . . . , M8 is characterized in that to read data from a selected cell transistor, non-selected cell transistors in the same NAND column must be turned on and have their data read. That is, the word lines WL to the non-selected cell transistors are provided with a sufficiently high potential as a read potential Vread. Only the word line WL to the selected transistor is provided with a determination potential VWLread used to determine whether the data is "0" or "1".

At this time, if the provided read potential Vread is not sufficiently high, the non-selected cell transistors are turned off. Consequently, no cell currents flow regardless of the threshold voltage of the selected cell transistor. On the other hand, if the non-selected cell transistors are not sufficiently turned on, so that a read operation is performed while much channel resistance is remaining, then a cell current flows through the non-selected cell transistors to reduce their voltages. This increases the source potential of the selected cell transistor.

In such a case, a back bias effect or the effect of a decrease in the gate-source potential of the selected cell transistor inconveniently causes the threshold voltage of the selected cell transistor to be detected to have a value larger than its original one. Thus, with the NAND type EEPROM, the set value for the read potential Vread is a very important device specification.

Figure 3:
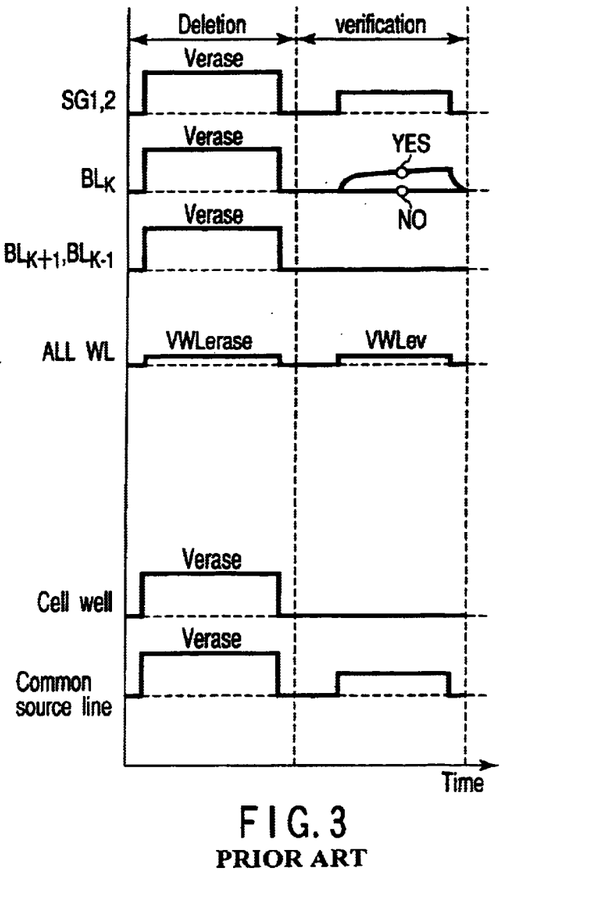
FIG. 3 is a time chart showing deletion verification in the conventional NAND type EEPROM.

Next, FIG. 3 is a time chart for deletion verification in the NAND type EEPROM.

The deletion verification is an operation of determining whether or not a deleting operation has been successfully performed on all cell transistors, i.e. whether or not all cell transistors have negative threshold voltages. No negative potentials required for this determination can be output to the word lines of the NAND type EEPROM. Thus, an approach different from the above read method is required in order to determine whether or not the cell transistors have negative threshold values. First, a high potential is provided to the common source line SL to set the bit lines $BL_k$ at a predetermined low potential. Subsequently, by setting the potentials at the word lines WL and selection gates SG1 and SG2 in a selected NAND column, to appropriate values, a cell current flows from the common source line SL to the bit line $BL_k$ to charge this line $BL_k$. As a result, the potential across the bit line $BL_k$ increases from a small value to provide a back bias effect. This makes it possible to detect a threshold voltage lower than the set word line potential (see, for example, Jpn. Pat. Appln. KOKAI Publication Nos. 7-161852 and 11-250676).

For the NAND type EEPROM, a minimum deletion size called a "block" is specified. Normally, a deleting operation is simultaneously performed on all cell transistors in the same NAND column. Subsequently, a read operation is performed by providing a sufficiently low determination potential VWLev to all word lines WL1 to WL8 in the NAND column. All cell transistors in the NAND column can have their threshold voltages determined at once by providing the same potential to all word lines. As a result, deletion verification can be carried out at high speed.

In the NAND type EEPROM, if a read operation is performed as described above, the effect of the previously described cell channel resistance is not negligible. In particular, if data is barely deleted from the cell transistors, the cell transistors have the maximum channel resistance. Accordingly, the back bias effect in the NAND column increases the threshold voltages to cause it to be determined that the deletion has not been completed yet. As a result, in a deletion verification operation, a deletion determination is made after the deletion has progressed sufficiently deeply (over-deletion).

Thus, it is still impossible to perfectly reliably determine the threshold voltages of cell transistors for which a deletion determination is to be made. However, this is a condition that makes the deletion determination stricter. In other words, it can be determined that the deletion is sufficient, on the basis of the results of the deletion verification.

However, as the structures of cell transistors become finer and finer, the over-deletion poses a critical problem because it may degrade cell reliability. Further, to suppress the degradation of a mis-write characteristic associated with the finer structures of cell transistors, local self boost (LSB) writes have been developed which utilize the cutoff characteristic of the cell transistors. Thus, it has been desirable to set a lower limit value for the threshold voltages of cell transistors after deletion.

Thus, two requirements have arisen for the threshold voltages of cell transistors after deletion. That is, the threshold voltages must be deep enough to avoid a non-deletion state even with a change in surrounding environments and must also be shallow enough to obtain a sufficient cutoff characteristic at a predetermined gate voltage. To meet these requirements, it is an important object to improve the accuracy with which the threshold voltages of cell transistors are determined after deletion.

BRIEF SUMMARY OF THE INVENTION

According to an aspect of the present invention, there is provided a non-volatile semiconductor storage device comprising a NAND column having a plurality of memory cell transistors connected in series by a current passage; a plurality of word lines connected to gates of the plurality of memory cell transistors in the NAND column; word line drive circuits which drive the plurality of word lines; a bit line connected to one end of the NAND column via a selection gate transistor; a bit line drive circuit which drives the bit line; a source line connected to the other end of the NAND column via a selection gate transistor; a source line drive circuit which drives the source line; and a potential supply circuit which supplies a potential to a semiconductor region in the NAND column in which the plurality of memory cell transistors are formed; wherein the word line drive circuits supply a low voltage to the plurality of word lines, wherein the potential supply circuit supplies a high potential higher than the low potential, to the semiconductor region in which the plurality of memory cell transistors are formed, to delete contents stored in the plurality of memory cell transistors, and wherein in deletion verification which verifies that the contents stored in the plurality of memory cell transistors have been deleted, a read is executed on each of the plurality of word lines, and in the read, the word line drive circuit provides the selected one of the plurality of word lines with a determination potential used to determine whether or not the contents have been deleted, while providing the other non-selected word lines with a read potential higher than the determination potential.

Further, according to an aspect of the present invention, there is provided a deletion verification method for a non-volatile semiconductor storage device having a NAND column having a plurality of series-connected memory cell transistors connected in series by a current passage and a plurality of word lines connected to gates of the plurality of memory cell transistors in the NAND column, comprising: supplying a low potential to the plurality of word lines, while supplying a high potential higher than the low potential, to a semiconductor region in which the plurality of memory cell transistors are formed, to delete contents stored in the plurality of memory cell transistors; and in deletion verification, executing a read on each of the plurality of word lines, and in the read, providing the selected one of the plurality of word lines with a determination potential used to determine whether or not the contents have been deleted, while providing the other non-selected word lines with a read potential higher than the determination potential.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

DETAILED DESCRIPTION OF THE INVENTION

As embodiments of the present invention, NAND type EEPROMs, which belong to non-volatile semiconductor storage devices, will be described below by way of example with reference to the drawings. In the description, common parts are denoted by common reference numerals throughout the drawings.

First Embodiment

Figure 4A:
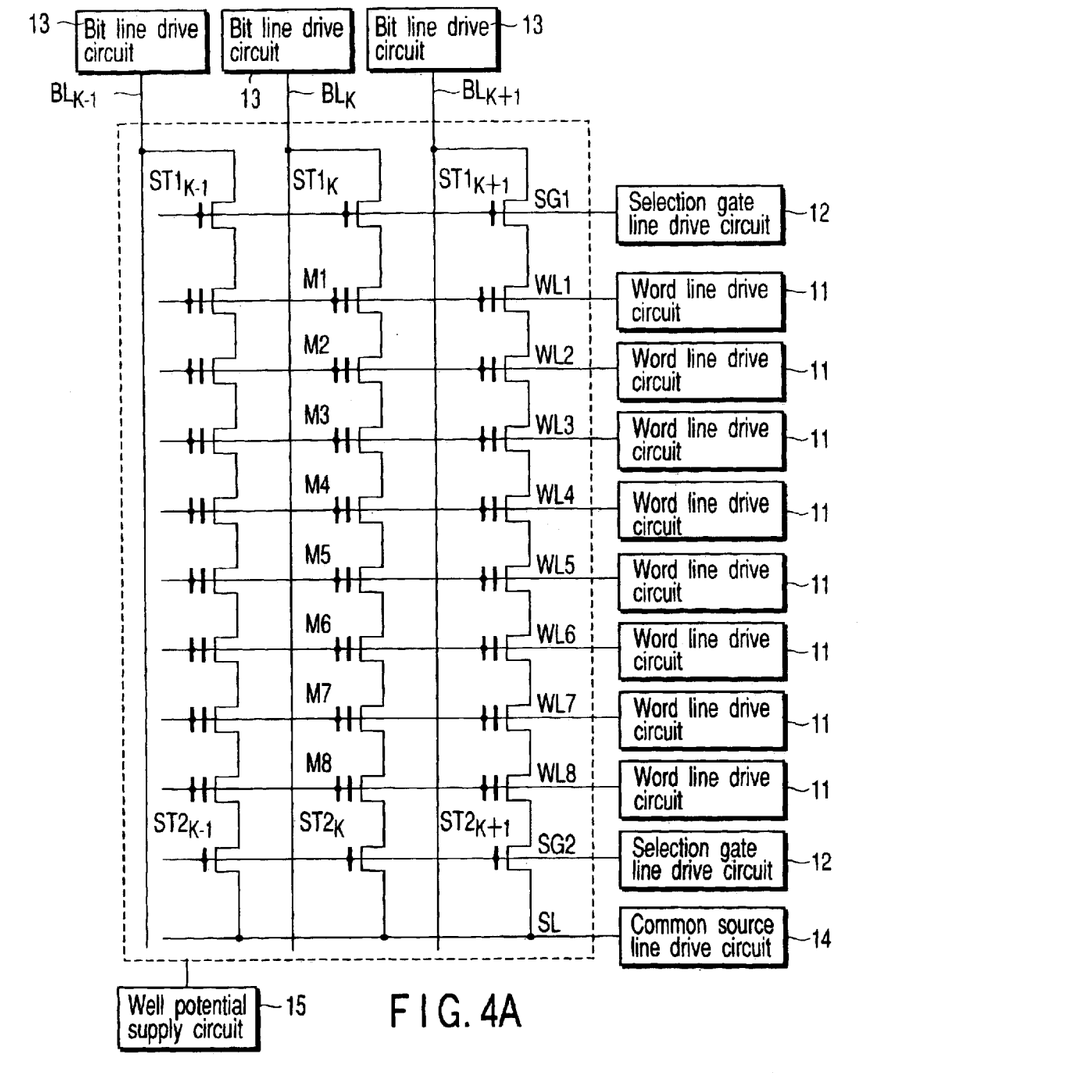
FIG. 4A is a circuit diagram showing a configuration of a NAND type EEPROM according to a first embodiment of the present invention.

First, a NAND type EEPROM according to a first embodiment of the present invention will be described. FIG. 4A is a circuit diagram showing a configuration of the NAND type EEPROM according to the first embodiment.

Figure 4B:
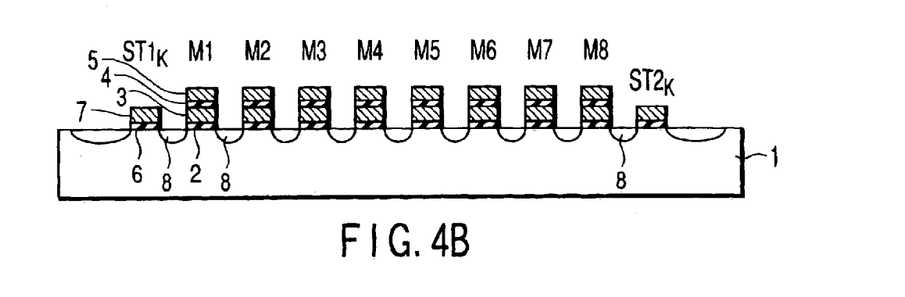
FIG. 4B is a sectional view of a NAND column and selection gate transistors in the NAND type EEPROM according to the first embodiment.

As shown in FIG. 4A, memory cell transistors M1, M2, . . . , M8 each having a control gate and a floating gate are connected in series by a current passage to constitute a NAND column. Selection gate transistors $ST1_k$ and $ST2_k$ are connected to the respective ends of this NAND column. FIG. 4B shows the sectional structure of the NAND column and selection gate transistors. Each of the memory cell transistors M1, M2, ..., M8 has a stacked structure in which a floating gate (or a charge accumulating film) 3, a second gate insulating film 4, and a control gate 5 are stacked on a silicon semiconductor substrate 1 via a first gate insulating film 2. Each of the selection gate transistors $ST1_k$ and $ST2_k$ has a structure in which a control gate 7 is formed on the silicon semiconductor substrate 1 via a gate insulating film 6. Source drain diffusion layers 8 are formed between the memory cell transistors, between the memory cell transistor M1 and the selection gate transistor $ST1_k$, and between the memory cell transistor M8 and the selection gate transistor $ST2_k$.

Word lines WL1, WL2, ..., WL8 are connected to the control gates of the cell transistors M1, M2, ..., M8, respectively. A selection gate line SG1 is connected to the selection gate transistor $ST1_k$. A selection gate line SG2 is connected to the selection gate transistor $ST2_k$. Furthermore, a bit line $BL_k$ is connected to the selection gate transistor $ST1_k$. A common source line SL is connected to the selection gate transistor $ST2_k$.

Further, a plurality of NAND columns having their gates connected to the word lines WL1, WL2, ..., WL8 are arranged close to the above NAND column. A selection gate transistor $ST1_{k-1}$ or $ST1_{k+1}$ having its gate connected to the selection gate line SG1 is connected to one end of each of these NAND columns. Bit lines $BL_{k-1}$ and $BL_{k+1}$ are connected to the selection gate transistors $ST1_{k-1}$ and $ST1_{k+1}$, respectively. Furthermore, a selection gate transistor $ST2_{k-1}$ or $ST2_{k+1}$ having its gate connected to the selection gate line SG2 is connected to the other end of each of these NAND columns. A common source line SL is connected to the selection gate transistors $ST2_{k-1}$ and $ST2_{k+1}$.

Moreover, the word lines WL1 to WL8 are provided with respective word line drive circuits 11. The selection gate lines SG1 and SG2 are provided with respective selection gate line drive circuits 12. The bit lines $BL_{k-1}$, $BL_k$, and $BL_{k+1}$ are provided with bit line drive circuits 13 each including a sense amplifier. The common source line SL is provided with a common source line drive circuit 14. Furthermore, a well potential supply circuit 15 is provided to supply potentials to well regions in which the cell transistors and the selection gate transistors are formed.

Now, description will be given of a deletion verification operation in the NAND type EEPROM shown in FIG. 4A.

Figure 5:
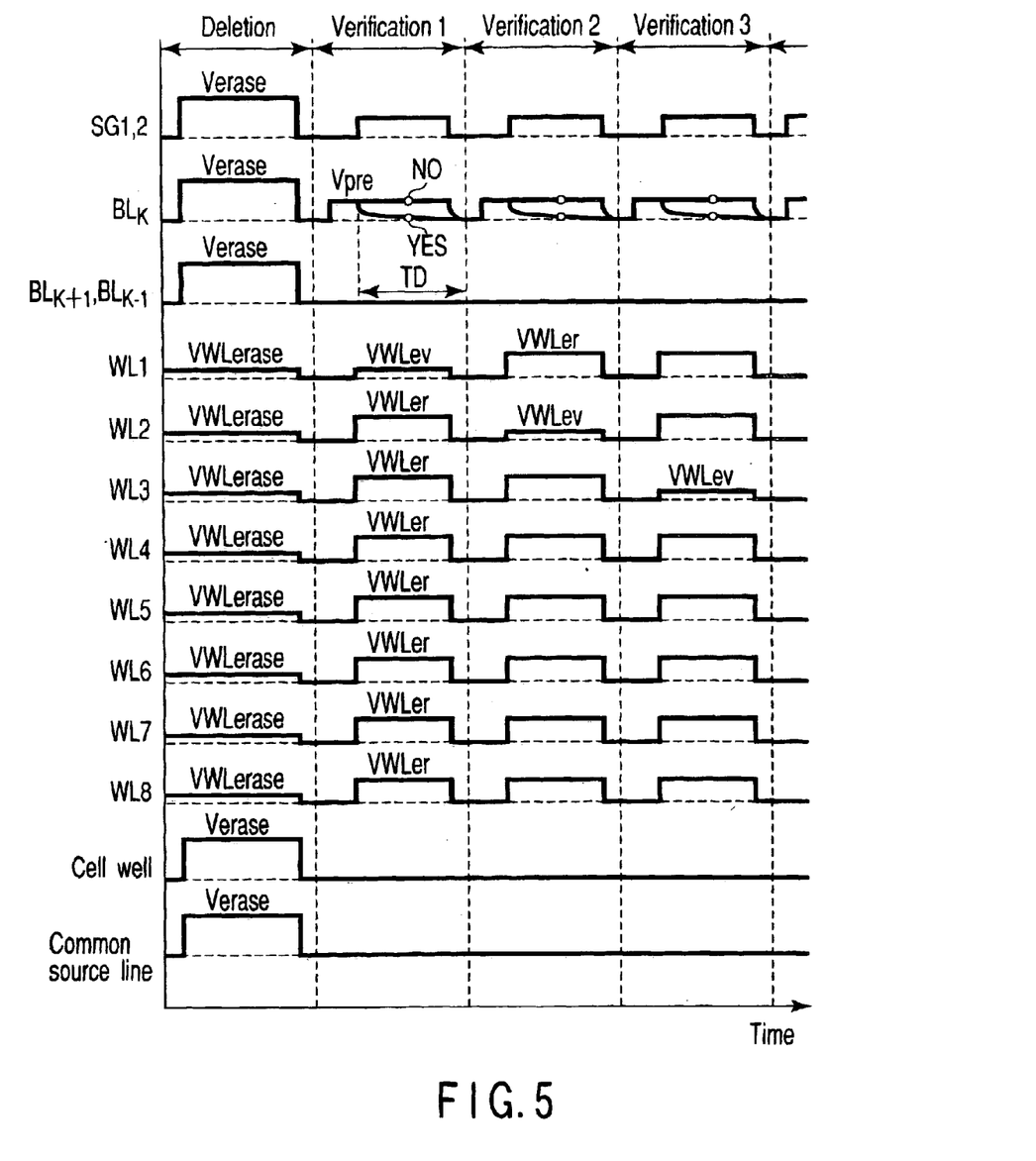
FIG. 5 is a time chart showing deletion verification in the NAND type EEPROM according to the first embodiment.

FIG. 5 is a time chart showing deletion verification in the NAND type EEPROM according to the first embodiment.

First, deletion is carried out by using the word line drive circuits 11 to provide a sufficiently low potential VWLerase to the word lines WL1 to WL8 within a selected block and using the well potential supply circuit 15 to increase the potentials at the cell wells up to a high potential Verase required for the deletion. Thus, electrons are removed from all cell transistors within the block through their floating gates. At this time, the selection gate lines SG1 and SG2, the bit lines $BL_{k-1}$ and $BL_k$, and $BL_{k+1}$, and the common source line SL are set to have the high potential Verase. The cell wells refer to the well regions in which the cell transistors and the selection gate transistors are formed.

Subsequently, deletion verification is carried out after the high potential Verase of the cell wells has been discharged. In the deletion verification, a read operation is performed for each of the word lines WL1 to WL8 within the selected block (verification 1 to verification 8).

In verification 1, the word line drive circuit 11 provides the selected word line WL1 with a deletion verification determination voltage VWLev, while providing the non-selected word lines WL2 to WL8 with a deletion verification read voltage VWLer. Furthermore, the bit line drive circuit 13 provides the bit line $BL_k$ with a precharge potential Vpre. The selection gate drive circuit 12 provides the selection gate lines SG1 and SG2 with a potential sufficient to turn on the selection gate transistors $ST1_k$ and $ST2_k$. The cell wells and the common source line SL are all at 0 V because the high potential Verase has been discharged from them.

Thus, when a deleting operation has been successfully performed on the selected cell transistor, i.e. when the threshold voltage of the selected cell transistor is equal to or lower than the deletion verification determination potential VWLev, the cell transistors M1 to M8, including the selected cell transistor, and the selection gate transistors $ST1_k$ and $ST2_k$ all become conductive. Accordingly, the precharge potential Vpre is discharged from the bit line $BL_k$ (Yes in FIG. 5). On the other hand, when a deleting operation has not been successfully performed on the selected cell transistor, i.e. when the threshold voltage of the selected cell transistor is higher than the deletion verification determination potential VWLev, the selected cell transistor becomes non-conductive. Accordingly, the precharge potential Vpre is not discharged from the bit line $BL_k$ (No in FIG. 5). The potential across the bit line $BL_k$ is detected by the sense amplifier included in the bit line drive circuit 13.

Desirably, the deletion verification read potential VWLer is sufficiently higher than the deletion verification determination potential VWLev.

In verification 2, the word line drive circuit 11 provides the selected word line WL2 with the deletion verification determination voltage VWLev, while providing the non-selected word lines WL1 and WL3 to WL8 with the deletion verification read voltage VWLer. Furthermore, the bit line drive circuit 13 provides the bit line $BL_k$ with the precharge potential Vpre. The selection gate drive circuit 12 provides the selection gate lines SG1 and SG2 with a potential sufficient to turn on the selection gate transistors $ST1_k$ and $ST2_k$. The cell wells and the common source line SL are all at 0 V because the high potential Verase has been discharged from them.

Thus, when a deleting operation has been successfully performed on the selected cell transistor, i.e. when the threshold voltage of the selected cell transistor is equal to or lower than the deletion verification determination potential VWLev, the cell transistors M1 to M8, including the selected cell transistor, and the selection gate transistors $ST1_k$ and $ST2_k$ all become conductive. Accordingly, the precharge potential Vpre is discharged from the bit line $BL_k$. On the other hand, when a deleting operation has not been successfully performed on the selected cell transistor, i.e. when the threshold voltage of the selected cell transistor is higher than the deletion verification determination potential VWLev, the selected cell transistor becomes nonconductive. Accordingly, the precharge potential Vpre is not discharged from the bit line $BL_k$.

In verification 3, the word line drive circuit 11 provides the selected word line WL3 with the deletion verification determination voltage VWLev, while providing the non-selected word lines with the deletion verification read voltage VWLer. The other operations are similar to those of the verifications 1 and 2, described previously.

Likewise, in verifications 4 to 8 (not shown), the word line drive circuits 11 provides the selected word lines WL4 to WL8 with the deletion verification determination voltage VWLev, while providing the non-selected word lines with the deletion verification read voltage VWLer. The other operations are similar to those of the verifications 1 and 2, described previously.

As described previously, in the verifications 1 to 8, it is determined whether or not a deleting operation has been successfully performed on a selected cell transistor. This determination is carried out as follows: once the precharge potential Vpre is discharged from the bit line $BL_k$ (Yes in FIG. 5), the selected cell transistor has a threshold voltage equal to or lower than the determination voltage VWLev. It is thus determined that a deleting operation has been successfully performed on the selected cell transistor. On the other hand, if the precharge potential Vpre is not discharged from the bit line $BL_k$ (No in FIG. 5), the selected cell transistor has a threshold voltage higher than the determination voltage VWLev. It is thus determined that a deleting operation has not been successfully performed on the selected cell transistor.

Such a deletion determination is carried out for all word lines WL1 to WL8 within the block. Then, the deletion is completed if it is determined that a deleting operation has been successfully performed on the cell transistors on all word lines. If it is determined that a deleting operation has not been successfully performed on the cell transistor on at least one word line, it is determined that the deletion is insufficient. Subsequently, the cell well potential Verase is further increased, and a deletion operation is then performed again. Then, a deletion operation and deletion determination are repeated until the result of the deletion determination becomes affirmative.

The above described deletion verification enables the accurate determination of the threshold voltages of cell transistors after deletion. Furthermore, it is possible to accurately control the threshold voltages of the cell transistors.

Further, in the verifications 1 to 8, shown in FIG. 5, the channel resistance of the non-selected self transistors can be reduced by sufficiently increasing the deletion verification read voltage VWLer. This makes it possible to accurately determine the threshold voltage of a selected cell transistor. If the word line drive circuits 11 do not undergo well separation and no negative potentials can thus be supplied to the word lines, then the deletion verification determination voltage VWLev is desirably 0, which is the lowest potential that can be generated by the word line drive circuits 11.

Further, it is assumed that in most cases, the verifications 1 to 8 are carried out after a deleting operation has been successfully performed on the cell transistors. Thus, in most cases, the threshold voltages of the cell transistors within the block each exhibit a deletion state, i.e. a negative state. Accordingly, compared to normal reads that require every threshold voltage to be assumed, this embodiment enables operational conditions to be improved.

Specifically, a cell current, which is expected to increase compared to normal reads, can be utilized to accomplish improvements such as a reduction in time TD required to discharge the potential across the bit line $BL_k$ as shown in FIG. 5 and a reduction in the deletion verification read voltage VWLer, provided to the non-selected cell transistors. If the discharge time TD is reduced, then the time required for verifying operations is expected to be substantially reduced compared to repeated normal read operations. At the same time, it is very effectively possible to adjust the negative (low-voltage-side) margin of the threshold voltage which makes the result of deletion determination affirmative.

Further, not only by the above method but also by increasing the potential at the cell wells up to a positive value, the negative margin of the threshold voltage can be ensured for deletion determination. By properly setting the cell well potential, the deletion verification determination potential VWLev, the deletion verification read potential VWLer, and the common source line potential, the negative margin can be ensured in substantially the same environments as those of normal reads. Accordingly, the threshold voltage can be determined much more accurately. Similar effects are also obtained by increasing the potential across the common source line in the cell transistors, up to a predetermined value.

Further, increasing the potential at the cell wells or across the common source line up to a predetermined positive value is particularly useful in a deletion verification operation performed immediately after deletion as described in this embodiment. That is, the discharge of the cell well potential or common source line potential, which has already increased to the high potential Verase, can be stopped before completion and shift directly to a deletion verification operation. This serves to save the times required to discharge and increase the cell well and common source line potentials.

Figure 6:
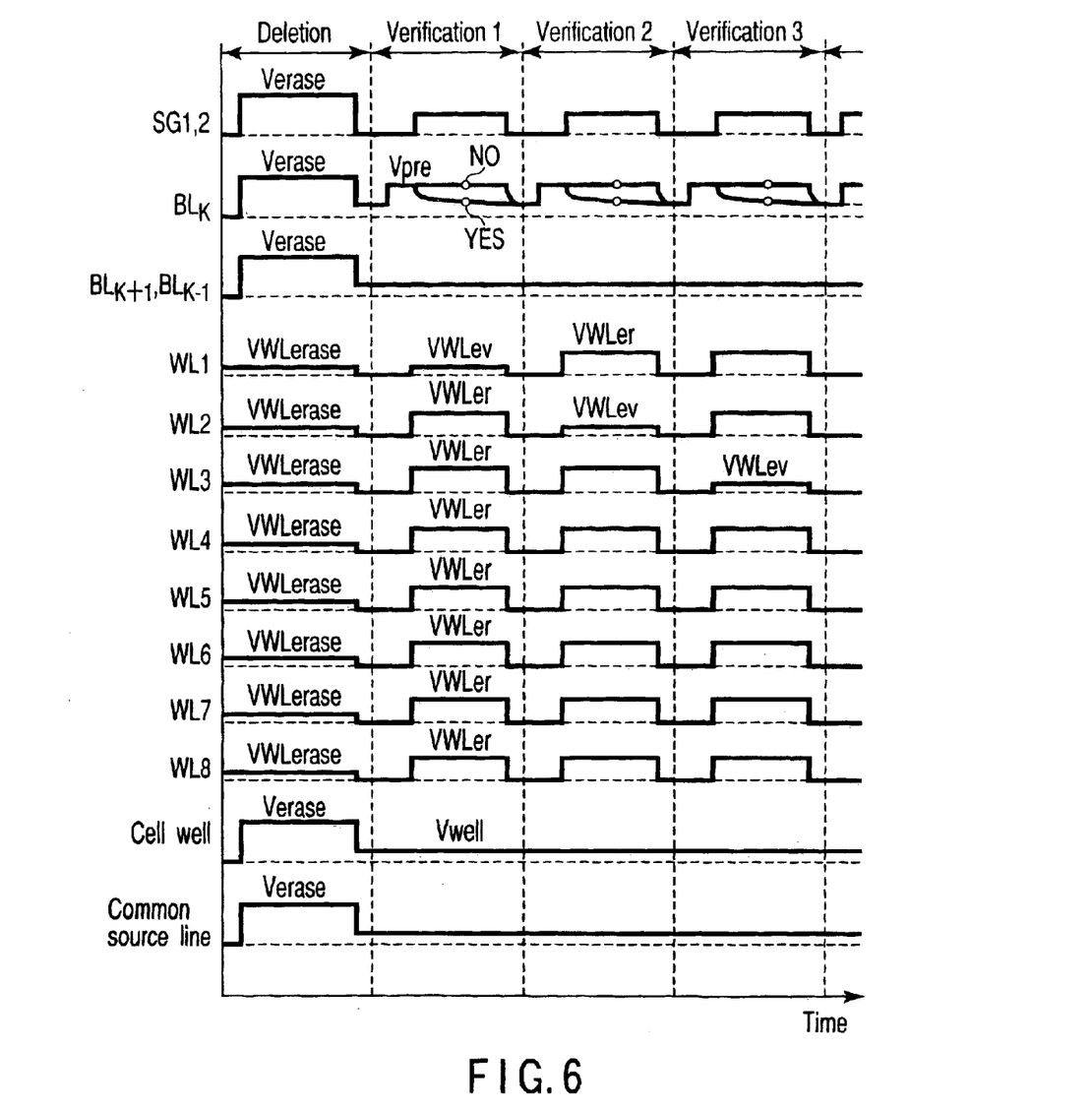
FIG. 6 is a time chart showing deletion verification in a NAND type EEPROM according to a variation of the first embodiment.

FIG. 6 is a time chart for deletion verification in which an increase in cell well potential, described previously, is stopped before completion and shifts to a verifying operation, as a variation of the first embodiment. In the verifications 1 to 8, a cell well potential Vwell is higher than the deletion determination potential VWLev. The other operational conditions are similar to those shown in FIG. 5.

For a read operation based on deletion verification, appropriate charges are accumulated in the bit line. In this embodiment, the non-selected word lines are provided with a sufficiently high deletion verification read potential VWLer. Accordingly, only one selected cell transistor is provided with a bit line potential (precharge potential Vpre) based on the charges accumulated in the bit line. Thus, the bit line potential is desirably set to be sufficiently low compared to the source-drain withstand voltage of the selected cell transistor.

As described above, in the first embodiment, a read operation is performed for each of the word lines within a selected block. This makes it possible to very accurately determine the threshold voltages of cell transistors after deletion. Furthermore, the threshold voltages can be controlled precisely.

Moreover, the variation of the first embodiment not only has the arrangements and settings of the first embodiment but also drastically improves the accuracy with which the threshold voltage is determined, by increasing the cell well potential up to the predetermined positive value.

Second Embodiment

Now, description will be given of a NAND type EEPROM according to a second embodiment of the present invention. In the first embodiment, described previously, deletion verification is carried out by performing a read operation for each word line. However, in the NAND type EEPROM according to the second embodiment, deletion verification is carried out by performing a read operation on every plural word lines after deletion. Components of the second embodiment which are similar to those of the first embodiment are denoted by the same reference numerals, with their description omitted. Description will be given below of only components different from those of the first embodiment.

Figure 7:
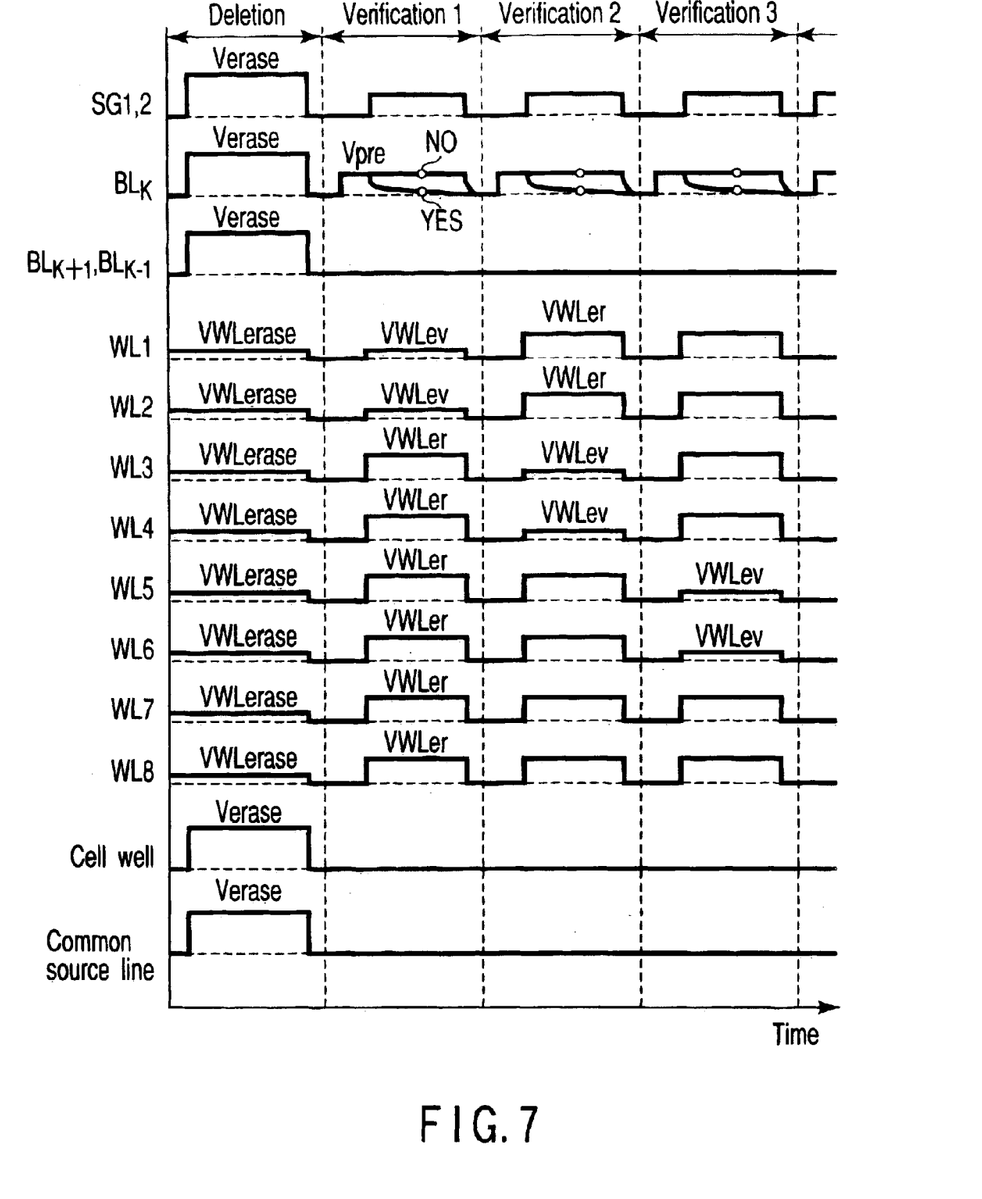
FIG. 7 is a time chart showing deletion verification in a NAND type EEPROM according to a second embodiment of the present invention.

In the NAND type EEPROM according to the second embodiment, a deletion verification operation is performed as follows:

FIG. 7 is a time chart of deletion verification in the NAND type EEPROM according to the second embodiment.

First, deletion is carried out by using the word line drive circuits 11 to provide the sufficiently low VWLerase to the word lines WL1 to WL8 within a selected block and using the well potential supply circuit 15 to increase the cell well potential up to the high potential Verase required for the deletion as in the first embodiment. Thus, electrons are removed from all cell transistors within the block through their floating gates.

Subsequently, the high potential Verase at the cell wells is discharged, and deletion verification is then carried out. In this deletion verification, a read operation is performed on every plural ones of the word lines WL1 to WL8 within the selected block. The number of the plural word lines for which a single read operation is performed has only to be two or more and smaller than the total number of word lines within the block. In this case, a read operation is performed every two word lines (verification 1 to verification 8).

In the verification 1, the word line drive circuits 11 provide the selected word lines WL1 and WL2 with the deletion verification determination voltage VWLev, while providing the non-selected word lines WL3 to WL8 with the deletion verification read voltage VWLer. Furthermore, the bit line drive circuit 13 provides the bit line $BL_k$ with the precharge potential Vpre. The selection gate line drive circuits 12 provide the selection gate lines SG1 and SG2 with a potential sufficient to turn on the selection gate transistors $ST1_k$ and $ST2_k$. The cell wells and the common source line SL are all at 0 V because the high potential Verase has been discharged from them.

Thus, when a deleting operation has been successfully performed on the selected cell transistor, i.e. when the threshold voltages of the selected cell transistors are equal to or lower than the deletion verification determination potential VWLev, the cell transistors M1 to M8, including the selected cell transistors, and the selection gate transistors $ST1_k$ and $ST2_k$ all become conductive. Accordingly, the precharge potential Vpre is discharged from the bit line $BL_k$ (Yes in FIG. 7). On the other hand, when a deleting operation has not been successfully performed on the selected cell transistor, i.e. when the threshold voltages of the selected cell transistors are higher than the deletion verification determination potential VWLev, the selected cell transistors become nonconductive. Accordingly, the precharge potential Vpre is not discharged from the bit line $BL_k$ (No in FIG. 7).

Desirably, the deletion verification read potential VWLer is sufficiently higher than the deletion verification determination potential VWLev.

In the verification 2, the word line drive circuits 11 provide the selected word lines WL3 and WL4 with the deletion verification determination voltage VWLev, while providing the other non-selected word lines WL1, WL2, and WL5 to WL8 with the deletion verification read voltage VWLer. The other operations are similar to those of the verification 1, described previously.

In the verification 3, the word line drive circuits 11 provide the selected word lines WL5 and WL6 with the deletion verification determination voltage VWLev, while providing to the other non-selected word lines WL1 to WL4, WL7, and WL8 with the deletion verification read voltage VWLer. The other operations are similar to those of the verification 1, described previously.

Likewise, in the verification 4 (not shown), the word line drive circuits 11 provides the selected word lines WL7 and WL8 with the deletion verification determination voltage VWLev, while providing the other non-selected word lines WL1 to WL6 with the deletion verification read voltage VWLer. The other operations are similar to those of the verification 1, described previously.

In the verifications 1 to 4, deletion determination, i.e. determination of whether or not a deleting operation has been successfully performed on the selected cell transistors is carried out as in the case with the first embodiment. That is, this operation is performed as follows: once the precharge potential Vpre is discharged from the bit line $BL_k$ (Yes in FIG. 7), the selected cell transistors have threshold voltages equal to or lower than the determination voltage VWLev. It is thus determined that a deleting operation has been successfully performed on the selected cell transistors. On the other hand, if the precharge potential Vpre is not discharged from the bit line $BL_k$ (No in FIG. 7), the selected cell transistors have threshold voltages higher than the determination voltage VWLev. It is thus determined that a deleting operation has not been successfully performed on the selected cell transistors.

Such a deletion determination is carried out for all word lines WL1 to WL8 within the block. Then, the deletion is completed if it is determined that a deleting operation has been successfully performed on the cell transistors on all word lines. If it is determined that a deleting operation has not been successfully performed on the cell transistor on at least one word line, it is determined that the deletion is insufficient. The cell well potential Verase is further increased, and a deletion operation is then performed again. Then, a deletion operation and deletion determination are repeated until the result of the deletion determination becomes affirmative.

The above described deletion verification performs a read operation on every plural word lines, thus sharply increasing operation speed compared to a read operation performed on each word line. Further, deletion verification speed increases consistently with the number of world lines read simultaneously.

However, when the number of word lines read simultaneously is increased, the number of word lines providing the deletion verification read potential VWLer decreases to gradually enhance the effect of the cell channel resistance. The increased cell channel resistance makes it difficult to shorten the discharge time. Thus, in the deletion verification, the optimum number of word lines read simultaneously is desirably set on the basis of the read voltage VWLer, the determination voltage VWLev, the verifying operation time, the accuracy with which the threshold voltages are determined for deletion determination, and the like.

As described above, in the second embodiment, a read operation is performed on every plural ones of the word lines within the selected block. Accordingly, the threshold voltages of cell transistors can be determined accurately after deletion. Further, the time required for deletion verification can be shortened. Furthermore, the threshold voltages can be controlled precisely.

Third Embodiment

Now, description will be given of an IC card in which the NAND type EEPROM according to the first or second embodiment is mounted, as a third embodiment of the present invention.

Recently, in more and more IC cards, e.g. memory cards, a NAND type EEPROM has been used as a main memory. A typical memory card includes a main memory and a controller that controls the main memory.

Figure 8:
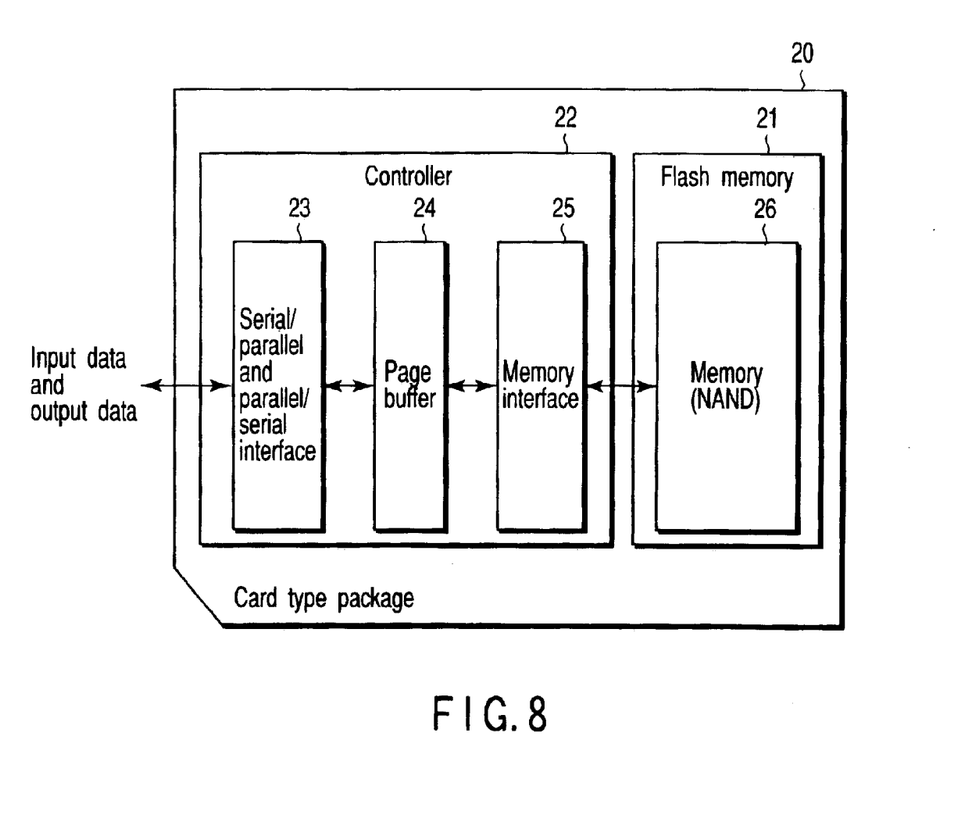
FIG. 8 is block diagram showing a configuration of an IC card according to a third embodiment of the present invention.

FIG. 8 is a block diagram showing a configuration of an IC card according to a third embodiment of the present invention.

As shown in FIG. 8, a main memory, e.g. a flash memory 21 and a controller 22 that controls the flash memory 21 are accommodated or mounted in or are stuck to a card type package 20. Thus, this device functions as an IC card, e.g. a memory card.

FIG. 8 shows only those of a number of circuit blocks included in the controller 22 which relate particularly to the main memory.

The circuit blocks relating to the main memory include, for example, a serial/parallel and parallel/serial interface 23, a page buffer 24, and a memory interface 25.

Before writing data to the flash memory 21, the serial/parallel and parallel/serial interface 23 converts, for example, serial input data into parallel internal data. The resultant parallel internal data is input to the page buffer 24, where it is accumulated. The accumulated internal data is written to the flash memory 21 via the memory interface 25.

Further, when data is read from the card type package 20, data read from the flash memory 21 is input to the page buffer 24 via the memory interface 25. The data is then accumulated in the page buffer 24. The accumulated internal data is input to the serial/parallel and parallel/serial interface 23. This parallel internal data is converted into serial output data, which is then output to the exterior of the card type package 20.

In the example shown in FIG. 8, a memory cell array in the flash memory 21 of the card type package 20 is composed of the NAND type EEPROM 26, described in the first or second embodiment.

As described above, according to the embodiments of the present invention, a non-volatile semiconductor storage device and its deletion verification method can be provided which enable the threshold voltages of cell transistors to be determined accurately after deletion while minimizing a decrease in the speed of a deletion verification operation.

Further, the previously described embodiments cannot only be individually implemented but can also be combined together. Furthermore, each of the previously described embodiments includes varies levels of inventions. The various levels of inventions can also be extracted by properly combining the plurality of components described in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor storage device comprising:
   a NAND column having a plurality of memory cell transistors connected in series by a current passage;
   a plurality of word lines connected to gates of the plurality of memory cell transistors in the NAND column;
   word line drive circuits which drive the plurality of word lines;
   a bit line connected to one end of the NAND column via a selection gate transistor;
   a bit line drive circuit which drives the bit line;
   a source line connected to the other end of the NAND column via a selection gate transistor;
   a source line drive circuit which drives the source line; and
   a potential supply circuit which supplies a potential to a semiconductor region in the NAND column in which the plurality of memory cell transistors are formed;
   wherein in deletion verification which verifies that the contents stored in the plurality of memory cell transistors have been deleted, a read is executed on each of the plurality of word lines, and in the read, the word line drive circuit provides the selected one of the plurality of word lines with a determination potential used to determine whether or not the contents have been deleted, while providing the other non-selected word lines with a read potential higher than the determination potential.

2. A non-volatile semiconductor storage device according to claim 1, wherein in the deletion verification, the potential supply circuit sets the potential in the semiconductor region in which the plurality of memory cell transistors are formed, to be higher than the determination potential.

3. A non-volatile semiconductor storage device according to claim 1, wherein after the contents stored in the memory cell transistors have been deleted, the threshold voltages of the memory cell transistors are lower than the determination voltage.

4. A non-volatile semiconductor storage device according to claim 1, wherein in the read during the deletion verification, whether or not the contents stored in the memory cell transistors have been deleted is determined depending on whether or not charges accumulated in the bit line have been discharged.

5. A non-volatile semiconductor storage device according to claim 4, wherein time required for the charges accumulated in the bit line to be discharged is shorter than time required for the charges accumulated in the bit line to be discharged during a normal read.

6. A non-volatile semiconductor storage device according to claim 1, wherein in the read during the deletion verification, the read potential provided to the non-selected word lines is lower than a potential provided to the non-selected word lines during a normal read.

7. A non-volatile semiconductor storage device according to claim 1, wherein the memory cell transistor includes a stacked structure in which a floating gate, a second gate insulating film, and a control gate are stacked on a silicon substrate via a first gate insulating film in this order.

8. A non-volatile semiconductor storage device comprising:
   a NAND column having a plurality of memory cell transistors connected in series by a current passage;
   a plurality of word lines connected to gates of the plurality of memory cell transistors in the NAND column;
   word line drive circuits which drive the plurality of word lines;
   a bit line connected to one end of the NAND column via a selection gate transistor;
   a bit line drive circuit which drives the bit line;
   a source line connected to the other end of the NAND column via a selection gate transistor;
   a source line drive circuit which drives the source line; and
   a potential supply circuit which supplies a potential to a semiconductor region in the NAND column in which the plurality of memory cell transistors are formed;
   wherein the word line drive circuits supply a low voltage to the plurality of word lines, wherein the potential supply circuit supplies a high potential higher than the low potential, to the semiconductor region in which the plurality of memory cell transistors are formed, to delete contents stored in the plurality of memory cell transistors, and wherein in deletion verification which verifies that the contents stored in the plurality of memory cell transistors have been deleted, a read is executed on every predetermined number of word lines of the plurality of word lines, the number of the predetermined number of word lines being at least two and smaller than the total number of word lines, and in the read, the word line drive circuit provides the selected ones of the plurality of word lines with a determination potential used to determine whether or not the contents have been deleted, while providing the other non-selected word lines with a read potential higher than the determination potential.

9. A non-volatile semiconductor storage device according to claim 8, wherein in the deletion verification, the potential supply circuit sets the potential in the semiconductor region in which the plurality of memory cell transistors are formed, to be higher than the determination potential.

10. A non-volatile semiconductor storage device according to claim 8, wherein after the contents stored in the memory cell transistors have been deleted, the threshold voltages of the memory cell transistors are lower than the determination voltage.

11. A non-volatile semiconductor storage device according to claim 8, wherein in the read during the deletion verification, whether or not the contents stored in the memory cell transistors have been deleted is determined depending on whether or not charges accumulated in the bit line have been discharged.

12. A non-volatile semiconductor storage device according to claim 11, wherein time required for the charges accumulated in the bit line to be discharged is shorter than time required for the charges accumulated in the bit line to be discharged during a normal read.

13. A non-volatile semiconductor storage device according to claim 8, wherein in the read during the deletion verification, the read potential provided to the non-selected word lines is lower than a potential provided to the non-selected word lines during a normal read.

14. A non-volatile semiconductor storage device according to claim 8, wherein the memory cell transistor includes a stacked structure in which a floating gate, a second gate insulating film, and a control gate are stacked on a silicon substrate via a first gate insulating film in this order.

15. A deletion verification method for a non-volatile semiconductor storage device having a NAND column having a plurality of memory cell transistors connected in series by a current passage and a plurality of word lines connected to gates of the plurality of memory cell transistors in the NAND column, the method comprising:
supplying a low potential to the plurality of word lines, while supplying a high potential higher than the low potential, to a semiconductor region in which the plurality of memory cell transistors are formed, to delete contents stored in the plurality of memory cell transistors; and
executing a read on each of the plurality of word lines, and in the read, providing the selected one of the plurality of word lines with a determination potential used to determine whether or not the contents have been deleted, while providing the other non-selected word lines with a read potential higher than the determination potential.

16. A deletion verification method for a non-volatile semiconductor storage device according to claim 15, wherein in the deletion verification, the potential in the semiconductor region in which the plurality of memory cell transistors are formed is set to be higher than the determination potential.

17. A deletion verification method for a non-volatile semiconductor storage device according to claim 15, wherein after the contents stored in the memory cell transistors have been deleted, the threshold voltages of the memory cell transistors are lower than the determination voltage.

18. A deletion verification method for a non-volatile semiconductor storage device according to claim 15, wherein in the deletion verification, whether or not the contents stored in the memory cell transistors have been deleted is determined depending on whether or not charges accumulated in the bit line have been discharged.

19. A deletion verification method for a non-volatile semiconductor storage device according to claim 18, wherein time required for the charges accumulated in the bit line to be discharged is shorter than time required for the charges accumulated in the bit line to be discharged during a normal read.

20. A deletion verification method for a non-volatile semiconductor storage device according to claim 15, wherein in the read during the deletion verification, the read potential provided to the non-selected word lines is lower than a potential provided to the non-selected word lines during a normal read.

21. A deletion verification method for a non-volatile semiconductor storage device according to claim 15, wherein the memory cell transistor includes a stacked structure in which a floating gate, a second gate insulating film, and a control gate are stacked on a silicon substrate via a first gate insulating film in this order.

22. A deletion verification method for a non-volatile semiconductor storage device having a NAND column having a plurality of memory cell transistors connected in series by a current passage and a plurality of word lines connected to gates of the plurality of memory cell transistors in the NAND column, the method comprising:
supplying a low potential to the plurality of word lines, while supplying a high potential higher than the low potential, to a semiconductor region in which the plurality of memory cell transistors are formed, to delete contents stored in the plurality of memory cell transistors; and
executing a read on every predetermined number of word lines of the plurality of word lines, the number of the predetermined number of word lines being at least two and smaller than the total number of word lines, and in the read, providing the selected ones of the plurality of word lines with a determination potential used to determine whether or not the contents have been deleted, while providing the other non-selected word lines with a read potential higher than the determination potential.

23. A deletion verification method for a non-volatile semiconductor storage device according to claim 22, wherein in the deletion verification, the potential in the semiconductor region in which the plurality of memory cell transistors are formed is set to be higher than the determination potential.

24. A deletion verification method for a non-volatile semiconductor storage device according to claim 22, wherein after the contents stored in the memory cell transistors have been deleted, the threshold voltages of the memory cell transistors are lower than the determination voltage.

25. A deletion verification method for a non-volatile semiconductor storage device according to claim 22, wherein in the deletion verification, whether or not the contents stored in the memory cell transistors have been deleted is determined depending on whether or not charges accumulated in the bit line have been discharged.

26. A deletion verification method for a non-volatile semiconductor storage device according to claim 25, wherein time required for the charges accumulated in the bit line to be discharged is shorter than time required for the charges accumulated in the bit line to be discharged during a normal read.

27. A deletion verification method for a non-volatile semiconductor storage device according to claim 22, wherein in the read during the deletion verification, the read potential provided to the non-selected word lines is lower than a potential provided to the non-selected word lines during a normal read.

28. A deletion verification method for a non-volatile semiconductor storage device according to claim 22, wherein the memory cell transistor includes a stacked structure in which a floating gate, a second gate insulating film, and a control gate are stacked on a silicon substrate via a first gate insulating film in this order.

* * * * *